(12) United States Patent
Lee et al.

(10) Patent No.: US 7,965,515 B2
(45) Date of Patent: Jun. 21, 2011

(54) HEAT RADIATING STRUCTURE FOR ELECTRONIC MODULE AND ELECTRONIC DEVICE HAVING THE SAME

(75) Inventors: Jung-Kee Lee, Osan-si (KR); Mun-Kue Park, Suwon-si (KR); Du-Chang Heo, Yongin-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/276,542

(22) Filed: Nov. 24, 2008

(65) Prior Publication Data

US 2009/0185354 A1 Jul. 23, 2009

(30) Foreign Application Priority Data

Jan. 17, 2008 (KR) ................ 10-2008-0005407

(51) Int. Cl.
*H05K 7/20* (2006.01)
(52) U.S. Cl. ........ 361/715; 361/688; 361/704; 361/707; 361/714
(58) Field of Classification Search ................ None
See application file for complete search history.

(56) References Cited

U.S. PATENT DOCUMENTS

| | | | | |
|---|---|---|---|---|
| 4,997,032 A | * | 3/1991 | Danielson et al. | 165/46 |
| 5,000,256 A | * | 3/1991 | Tousignant | 165/46 |
| 6,657,858 B2 | * | 12/2003 | Rothschild | 361/679.33 |
| 6,771,495 B2 | * | 8/2004 | Fujiwara et al. | 361/679.34 |
| 6,946,190 B2 | * | 9/2005 | Bunyan | 428/334 |
| 7,009,835 B2 | * | 3/2006 | Desai et al. | 361/679.36 |
| 7,012,805 B2 | * | 3/2006 | Shah et al. | 361/679.36 |
| 7,168,484 B2 | * | 1/2007 | Zhang et al. | 165/185 |
| 7,345,845 B2 | * | 3/2008 | Feliss et al. | 360/97.02 |
| 7,495,226 B2 | * | 2/2009 | Jadrich et al. | 250/370.09 |
| 7,519,402 B2 | * | 4/2009 | Son | 455/575.1 |
| 7,679,145 B2 | * | 3/2010 | He et al. | 257/401 |
| 2002/0097556 A1 | * | 7/2002 | Lee | 361/685 |
| 2003/0210524 A1 | * | 11/2003 | Berg et al. | 361/687 |
| 2006/0063018 A1 | * | 3/2006 | Krassowski et al. | 428/545 |
| 2006/0077638 A1 | * | 4/2006 | Salmon | 361/704 |
| 2006/0171124 A1 | | 8/2006 | Capp et al. | |
| 2007/0062676 A1 | | 3/2007 | Yao | |
| 2007/0063339 A1 | | 3/2007 | Yao | |
| 2007/0177348 A1 | | 8/2007 | Kehret et al. | |
| 2008/0131655 A1 | * | 6/2008 | Wacker et al. | 428/119 |
| 2008/0131722 A1 | * | 6/2008 | Suhir et al. | 428/616 |
| 2008/0149322 A1 | * | 6/2008 | Ottinger et al. | 165/185 |

FOREIGN PATENT DOCUMENTS

| | | |
|---|---|---|
| JP | 2006-336986 | 12/2006 |
| WO | WO 2007/142273 | 12/2007 |

* cited by examiner

*Primary Examiner* — Boris L Chervinsky
(74) *Attorney, Agent, or Firm* — Cha & Reiter, LLC

(57) ABSTRACT

A heat radiating structure for an electronic module and an electronic device having the same structure thereon. The heat radiating structure is formed at the bottom of the electronic module to release the generated heat from the electronic module, and includes an impact absorber, which absorbs impact transferred from the outside. A heat radiating sheet is formed with a plurality of the multi-layered heat conductive sheets and is in contact with the bottom of the electronic module by covering the outside of the impact absorber.

20 Claims, 7 Drawing Sheets

HEAT RADIATING STRUCTURE FOR ELECTRONIC MODULE AND ELECTRONIC DEVICE HAVING THE SAME

CLAIM OF PRIORITY

This application claims priority under 35 U.S.C. §119 from an application for "Heat Radiating Structure for Electronic Module and Electronic Device Having the Same" earlier filed in the Korean Intellectual Property Office on Jan. 17, 2008 and there duly assigned Serial No. 10-2008-0005407 and hereby incorporated by reference in its entirety.

BACKGROUND OF THE INVENTION

1. Field of the Invention

The present invention relates to a heat radiating structure for an electronic module and an electronic device having the same. More particularly, the present invention relates to a heat radiating structure which can quickly release heat from the electronic module outside, and for an electronic device having the same structure thereon.

2. Description of the Related Art

In accordance with the recent development of the overall industrial technologies, multi-functional electronic devices with superb quality have been continuously introduced these days.

Not only are the electronic devices of excellent quality and contain more multi-function capability than ever before, but such electronic devices also have been getting smaller and light-weighted. The reduced size and weight facilitates portability. However the reduced size introduces problems with heat release because of the high temperature generated form the densely packed components.

For example, the cellular phone is one of the most popularized electronic devices and has been upgraded with more superb qualities and multi-functions despite its increasingly minimized size and weight. Therefore, it is very easy for the user to carry and keep the cellular phone.

A plurality of the components are densely packed to fit in the thinner and smaller space of the cellular phone for better quality and multi-functionality than ever before. When high temperature is generated from one or more of the components inside, it is very difficult to dissipate generated high temperature to the outside of the cell phone.

Especially when the electronic modules, such as a projector module, which generates lots of heat, are installed inside the cell phone and are generating a great deal of heat during operation, the heat-release problem is getting worse.

To solve this kind of heat-release problem, the electronic devices having a heat radiating structure for releasing heat from an electronic module have been introduced.

FIG. 1 is a plan view of a prior art electronic device with a heat radiating structure for an electronic module. Referring now to FIG. 1, as an example of the electronic module of the prior art, a projector module 20 is installed inside the case of the electronic device like a cell phone case 10.

The projector module 20 includes a projection unit 21, which generates comparatively less heat, and a lighting unit 25, which generates comparatively lots of heat. The projection unit 21 includes a display unit 22 and an optical unit 23, and the lighting unit 25 includes an LED 26 as a light source and a substrate 27 formed with an LED 26 thereon.

Still referring to FIG. 1, a heat radiating structure for an electronic module 30 includes a heat transfer plate 31 formed to transfer heat from the projector module 20 to the outside by lengthening one side of the heavy heat generating part (hereinafter called as 'heavy heat generating part') to the exterior for a certain distance; and a heat insulating plate 33 formed at the other side of the heavy heat generating part in order not to transfer the generated heat from the heavy heat generating part of the projector module 20 to the inside of the projector module 20, where the other components are installed.

Accordingly, the heat transfer plate 31 is installed on one side of the lighting unit 25, which is the heavy heat generating part, by extending from one side of the lighting unit 25 to the exterior for a certain distance, and the heat insulating plate 33 is arranged in the other side of the lighting unit 25.

As shown in FIG. 1, the heat generated from the heavy heat generating part of the electronic module, which originated from the lighting unit 25 of the projector module 20, cannot be transferred to the inside, where the other components are arranged, by the heat insulating plate 33. It can be transferred outside only through the heat transfer plate 31. Thus, some of the heat release problems from the electronic devices are partially resolved by the structure shown in FIG. 1.

Despite the above-mentioned advantages of the device shown in FIG. 1, there are still various disadvantages as discussed below with the heat radiating structure for an electronic module 30 and the electronic device having the same heat radiating structure.

Firstly, because the heat transfer plate 31 of the heat radiating structure for an electronic module 30 show in FIG. 1 is installed on one side of the lighting unit 25, which is the heavy heat generating part, by extending from one side of the lighting unit 25 to the outside for a certain distance, there is a problem in that the heat transfer plate occupies a significant amount of space of the electronic device. As previously mentioned, the latest trend is to minimize the size and the weight of the electronic devices, and most of the components are getting smaller and arranged in a compact space. However, the above-mentioned configure of the heat transfer plate 31 is against the trend as the size might even have to be enlarged in order to efficiently transfer heat from the electronic device.

Secondly, the heat radiating structure for an electronic module 30 shown in FIG. 1 is comprises the heat insulating plate 33, which prevents the heat from the lighting unit 25 from being transferred into the inside components; and the heat transfer plate 31 that transfers the heat from the lighting unit 25 to the outside. It is advantageous that the heat generated from the lighting unit 25 can be only transferred to the outside except the inside where the other components are installed. However, there will be a large difference in temperature between the inside and the outside of the heat insulating plate 33 because of the above-mentioned function of the heat insulating plate 33. Consequently, it may cause the substrate 27 of the lighting unit 25 to bend or twist and thus adversely change the alignment of the LED 26 formed on the substrate 27.

In case of the projector module 20 installed on electronic devices such as shown in FIG. 1, the alignment of the LED 26 as a light source of the lighting unit 25 may be changed so as to cause a problem of improper operation.

SUMMARY OF THE INVENTION

The present invention provides a heat radiating structure for an electronic module and the electronic device having the same structure, in which the heat radiating function efficiently operates, and the minimized size and the weight is favorably reviewed by consumers.

The present invention is also directed to a heat radiating structure for an electronic module and the electronic device having the same structure, in which the temperature differences inside the electronic module will be resolved in advance, thereby preventing many problems that were heretofore part of conventional structures.

The present invention also provides a heat radiating structure for an electronic module and the electronic device having the same structure, in which the generated heat from the electronic module will be dissipated outside; and by absorbing the impact from the outside, the impact of the heat will be minimized or blocked before it reaches the electronic module.

According to an exemplary aspect of the present invention, there is provided a heat radiating structure for an electronic module. The exemplary heat radiating structure can include a heat radiating sheet formed in contact with at least one of outside surfaces of the electronic module to dissipate heat from the electronic module to the outside, the heat radiating sheet comprised of a plurality of multi-layered heat conductive sheets.

In another exemplary aspect of the present invention, a plurality of the heat conductive sheets may include a metal sheet and a graphite sheet layered on the metal sheet. Here, the metal sheet can be made of, for example, a copper material.

In a further exemplary aspect of the present invention, the heat radiating structure of the invention may further include an impact absorber installed between the heat radiating sheet and an outside surface of the electronic module so as to absorb impacts from outside. Here, the metal sheet can be made of, for example, a copper material.

According to another exemplary aspect of the present invention, there is provided a heat radiating structure for an electronic module. The heat radiating structure includes a heat radiating sheet formed in contact with at least one of a bottom surface and side surfaces of the electronic module, the side surfaces placed adjacent to the bottom surface, in order to dissipate heat from the electronic module to outside, the heat radiating sheet comprised of a plurality of multi-layered heat conductive sheets.

In yet another exemplary aspect of the present invention, a plurality of the heat conductive sheet may include a metal sheet and a graphite sheet layered on the metal sheet.

In a further exemplary aspect of the invention, at least one of the side surfaces of the electronic module in contact with the heat radiating sheet may comprise a side surface of a heavy heat generating part of the electronic module, which mainly generates heat.

In still another exemplary aspect of the present invention, the heat radiating structure of the invention may further include an impact absorber installed between the heat radiating sheet and the bottom surface of the electronic module to absorb impacts from outside. Here, the metal sheet can be made of, for example, a copper material.

According to a further exemplary aspect of the present invention, there is provided a heat radiating structure for an electronic module. The heat radiating structure dissipates heat from the electronic module to outside, and includes an impact absorber for absorbing outside impact; and a heat radiating sheet formed with a plurality of the multi-layered heat conductive sheets and contacting a bottom surface of the electronic module by covering outside of the impact absorber. The impact absorber can be made of, for example, a copper material.

In a further exemplary aspect of the present invention, a plurality of the heat conductive sheets may include a metal sheet and a graphite sheet layered on the metal sheet.

The heat radiating structure of the present invention, for example, may further include a heat conductive plate formed on a side surface of the electronic module adjacent to the bottom surface to transfer heat from the side surface of the electronic module to the heat radiating sheet. Here, the side surface of the electronic module in contact with the heat transfer plate can be a side surface of a heavy heat generating part of the electronic module, which mainly generates heat. In this case, the heat conductive plate can include a first contact part in contact with the side surface of the heavy heat generating part and a second contact part in contact with the heat radiating sheet, and the second contact part can be piled up on the heat radiating sheet.

According to still another exemplary aspect of the present invention, there is provided an electronic device, which includes a case; an electronic module which is fixed on a side of the case; and a heat radiating structure for an electronic module formed in contact with at least one of sides of the electronic module in order to dissipate heat from the electronic module to outside. The heat radiating structure comprises a heat radiating sheet comprised of a plurality of multi-layered heat conductive sheets.

The heat radiating sheet, for example, may be installed between the side of the case, where the electronic module is fixed, and an outside surface of the electronic module, which is opposite to the side of the case.

In addition, the heat radiating structure for an electronic module may further include an impact absorber formed between the heat radiating sheet and the surface of the electronic module to absorb impacts from outside.

In still another exemplary aspect of the present invention, a plurality of the heat conductive sheet may include a metal sheet and a graphite sheet layered on the metal sheet.

According to the present invention, the heat radiating structure for an electronic module may include a heat radiating sheet comprised of a plurality of the heat conductive sheets. Using the heat radiating structure for an electronic module in accordance with the present invention makes it possible not only to perform the heat release function but also to correspond with the trends for the minimization of the size and the weight.

Since the heat radiating structure for an electronic module of the present invention is formed without the heat insulating plate of the prior art, it is possible to solve the problems with the partial temperature differences caused by the heat insulating plate, and the other points at issue in advance.

Furthermore, the heat radiating structure for an electronic module according to the present invention can more include impact absorbers that absorb the impacts from outside. Using the heat radiating structure for the electronic module in accordance with the present invention makes it possible not only to dissipate the generated heat from the electronic module to the outside but also to block or minimize the impact from the outside and thereby not being transferred to the electronic module by absorbing it.

BRIEF DESCRIPTION OF THE DRAWINGS

The above and other exemplary objects, features and other advantages of the present invention will be more clearly understood from the following detailed description taken in conjunction with the accompanying drawings, in which.

DETAILED DESCRIPTION

Figure 1:
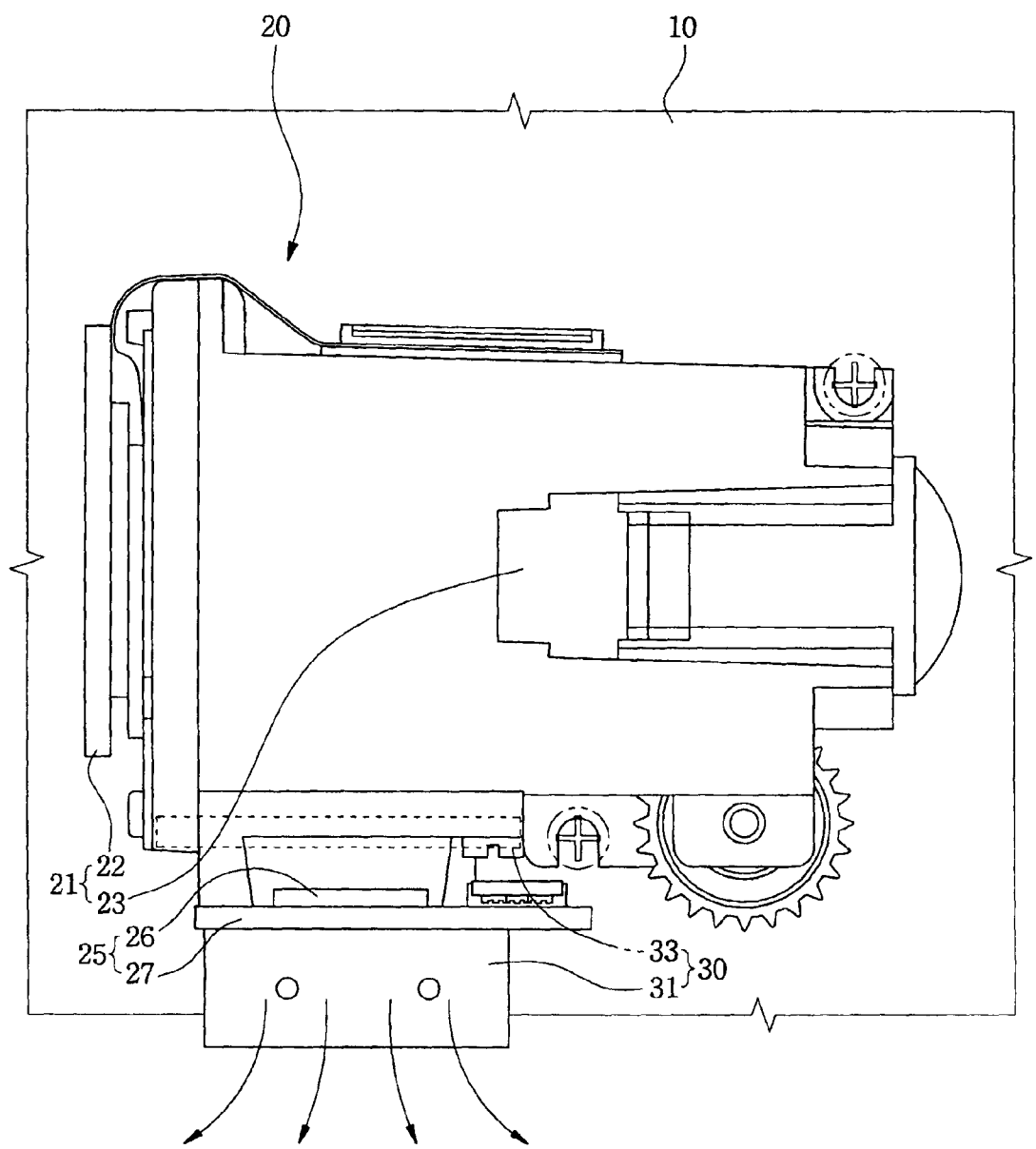
FIG. 1 is a plan view of illustrating an electronic device having a heat radiating structure for an electronic module of the prior art.

Hereinafter, exemplary embodiments of the invention provided solely for illustrative purposes will be described in detail with reference to the accompanying drawings. A projector module will be described as an exemplary embodiment of the electronic module, and a cellular phone will be described as an exemplary embodiment of the electronic device. However, the present invention is not limited to the exemplary embodiments described herein and various changes or features may be made in the functions and arrangement of the elements that are within the spirit of the invention and the scope of the appended claims. With regard to the drawings, the same reference numerals and signs are used throughout the different drawings to designate the same or similar components.

Figure 2:
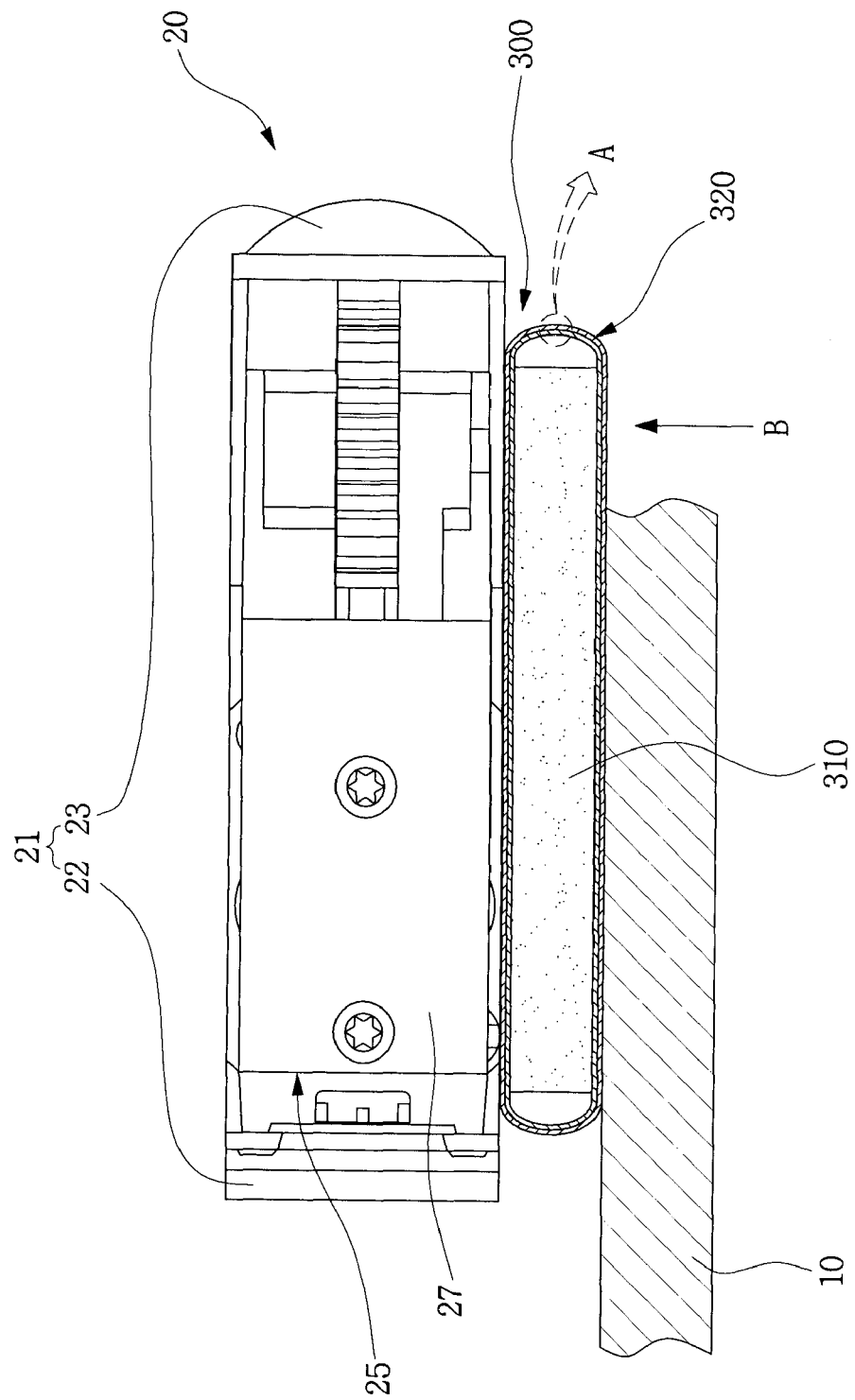
FIG. 2 is a cross-sectional view of an electronic device having a heat radiating structure for an electronic module in accordance with an exemplary embodiment of the invention.
Figure 3:
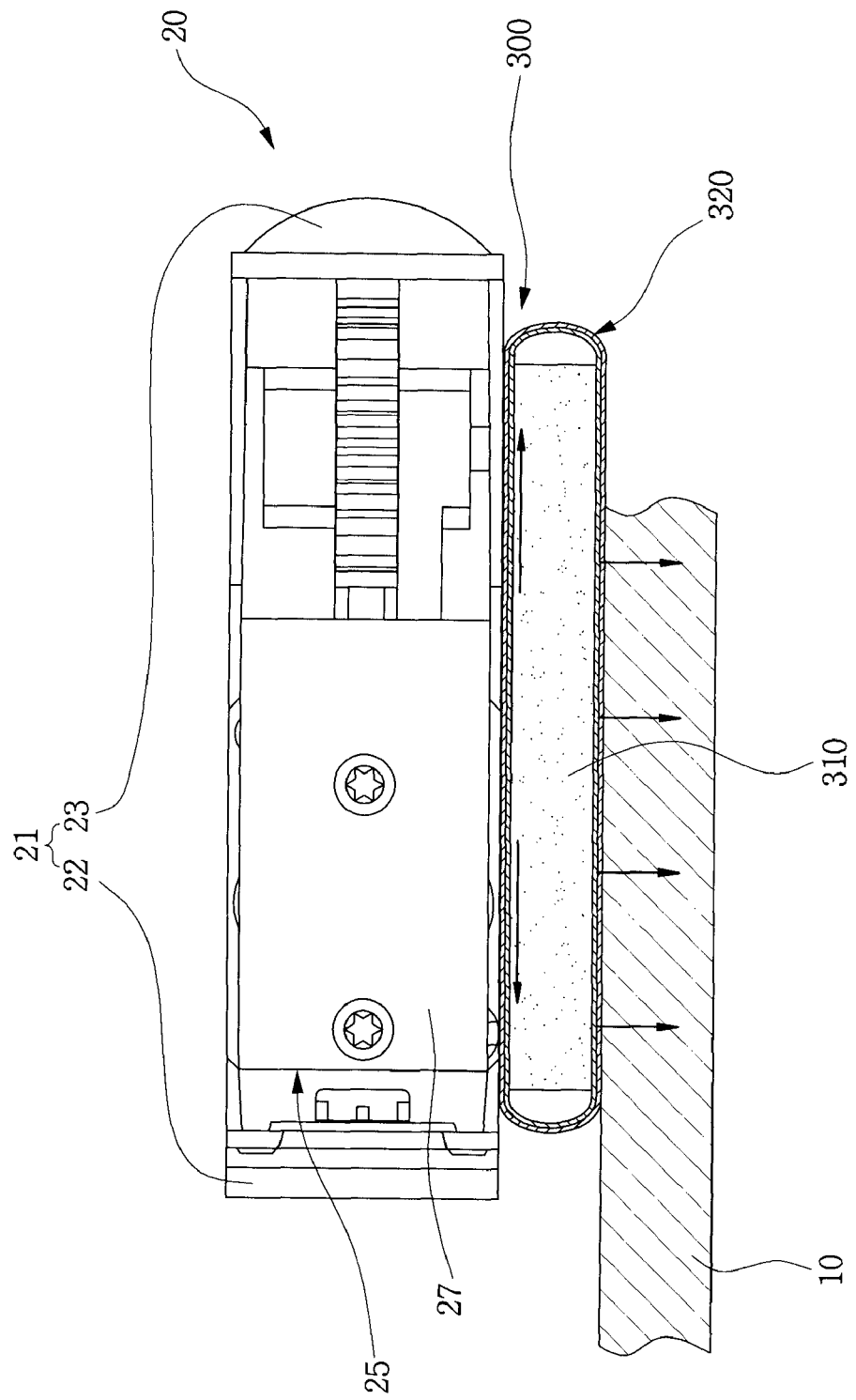
FIG. 3 is a cross-sectional view illustrating the heat flow of an electronic device in FIG. 2.
Figure 4:
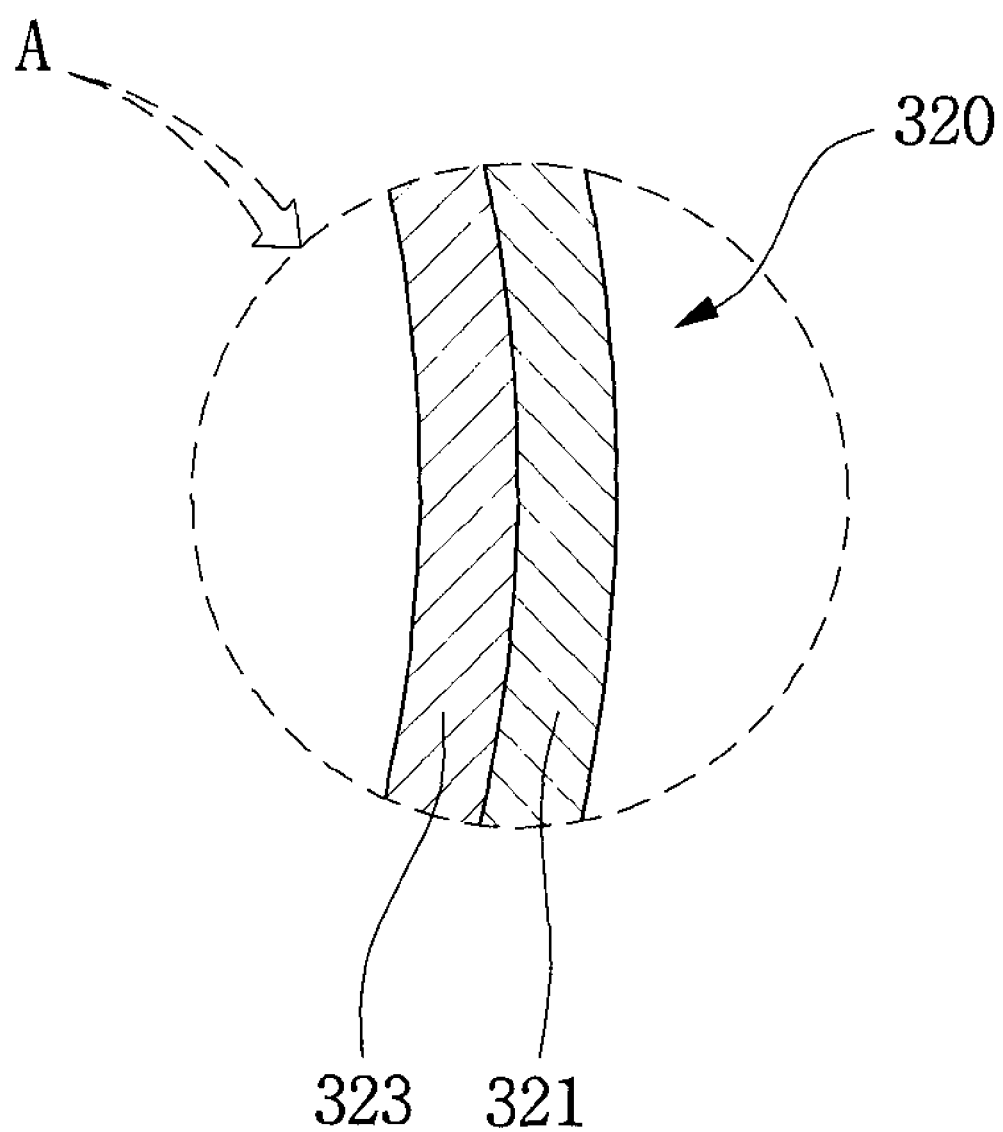
FIG. 4 is an enlarged cross-sectional view of the part 'A' in FIG. 2.
Figure 5:
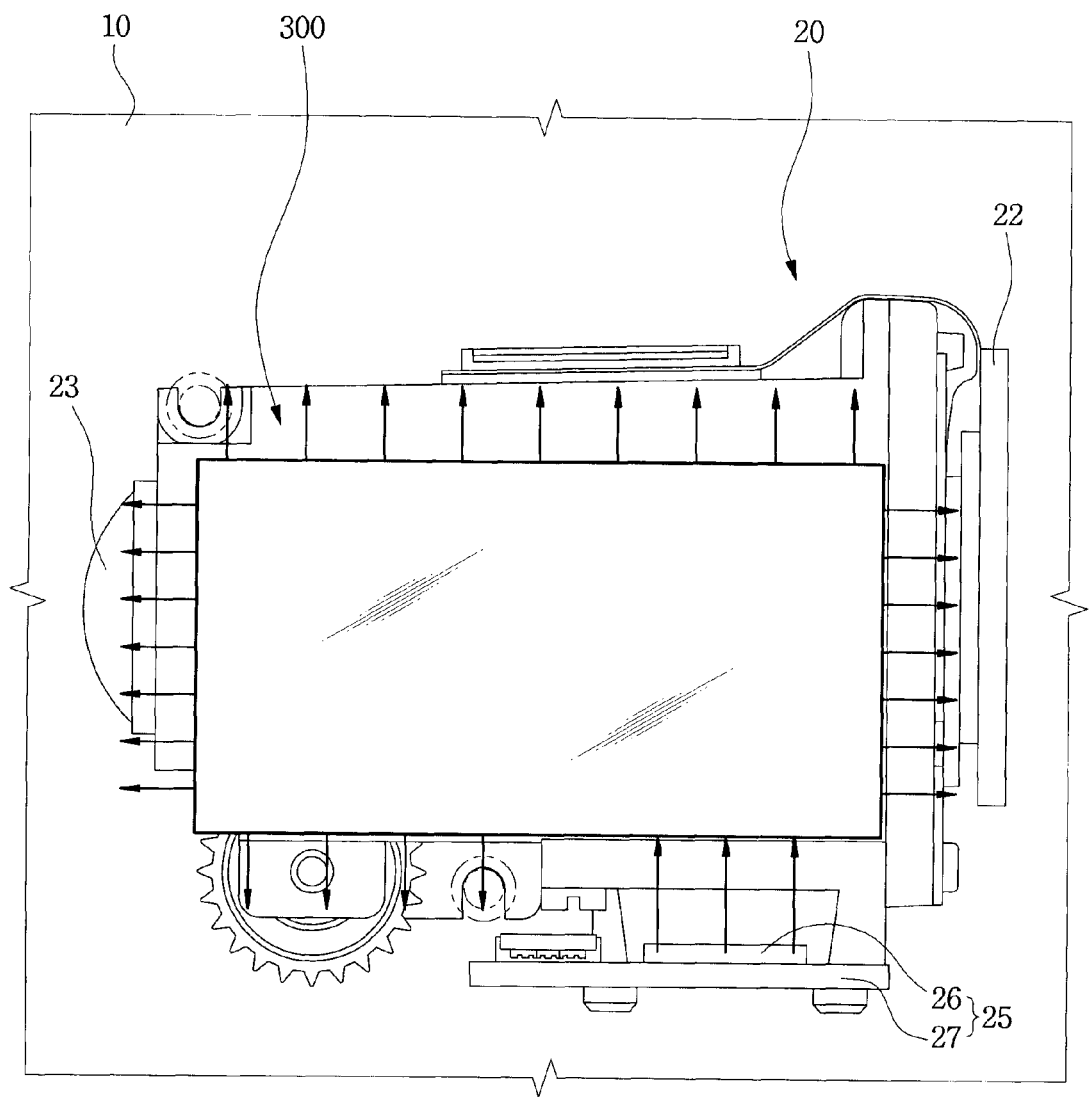
FIG. 5 is a bottom view of the electronic device from the direction 'B' in FIG. 2.

FIG. 2 is a side cross-sectional view of an electronic device having a heat radiating structure for an electronic module according to an exemplary embodiment of the present invention. FIG. 3 is a cross-sectional view illustrating the heat flow of an electronic device in FIG. 2, FIG. 4 is an enlarged cross-sectional view of the part 'A' in FIG. 2, and FIG. 5 is a bottom view of the electronic device from the direction 'B' in FIG. 2.

Referring now to the examples in FIGS. 2 to 5, a heat radiating structure 300 for an electronic module 20 in accordance with the exemplary embodiment releases heat from the electronic module 20 (i.e., a projector module 20 as an exemplary embodiment of the present invention, which will be hereinafter referred to as 'projector module 20') to the outside. The heat radiating structure 300 of the invention is preferably installed on an outside of the projector module 20, for example, the bottom of the projector module 20. In this example, the heat radiating structure 300 includes an impact absorber 310 and a heat radiating sheet 320 formed at one outer surface of the projector module 310, particularly, the bottom of the projector module 20 by covering the outer surfaces of the impact absorber 310. However, the heat radiating structure 300 in accordance with the present invention may be performed with a heat radiating sheet 320 only. It is also within the spirit of the claimed invention that the impact absorber and the heat radiating sheet may be comprised of a same or similar material.

Still referring to FIGS. 2 to 5, the impact absorber 310 functions to absorb the transferred impact from the outside, for example, the transferred impact from the case 10 of the electronic device, such as, for example, a cellular phone. The impact absorber 310 can be made of the high density urethane foam Poron™ produced by INOAC Corporation of Japan, which can shrink and relax with excellent impact absorption.

The heat radiating sheet 320 may comprise a plurality of multi-layered heat conductive sheets. At least some of the multiple heat conductive sheets can be respectively comprised of different types of heat conductive sheets. A plurality of the multi-layered heat conductive sheets may comprise a plurality of double-layered heat conductive sheets, such as shown in FIGS. 2 to 4. The heat conductive sheets may also be comprised of, for example, a metal sheet 323 (shown in FIG. 4) which is comparatively high conductive, and a graphite sheet 321, which is more conductive than the metal sheet 323 and can be piled on the metal sheet 323. The metal sheet 323 may be made of, for example, a copper material. When the heat radiating sheet 320 is comprised of a metal sheet 323 and a graphite sheet 321, the metal sheet 323 will be formed at the outside of the impact absorber 310 and the graphite sheet 321 will be formed on one side of the projector module 20.

As shown in FIGS. 2 and 3, in the heat radiating sheet 320 covering the surface of the impact absorber 310, the edges can be rounded. Even if the impact absorber 310 covered by the heat radiating sheet 320 are freely shrunk and relaxed, the edges of the heat radiating sheet 320 will not be torn up.

On the other hand, a projector module 20 in accordance with an exemplary embodiment can be fixed onto the case of the electronic device by, for example, a screw as shown in FIGS. 2 and 3, for example, at the bottom of the cellular phone case 10. However, it should be understand that any known fastening arrangement can be used in accordance with the claimed invention.

In this particular example, the heat radiating structure 300 in accordance with the present invention releases heat from the projector module 20 to the outside by being connected to an outside surface of the projector module 20, which is not affixed onto the cellular phone case 10. However, the heat radiating structure 300 can be formed between the one side of the cellular phone case 10, where the projector module 20 is fixed, and the outer surface of the projector module 20, which is opposing the one side of the cellular phone case 10; and the generated heat can be released from the projector module 20 in the direction of the cellular phone case 10.

Moreover, the heat radiating structure 300 in accordance with the present invention includes the impact absorber 310. When the heat radiating structure 300 is formed between one side of the fixed cellular phone case 10 and the outer surface of the projector module 20, which is in contact with the one side of the case 10, the impact absorber 310 in the heat radiating structure 300 can absorb the transferred impact from the outside, for example, the impact transferred from the one side of the cellular phone case 10.

Referring to FIGS. 2 and 3, a projection unit 21, which includes a display unit 22 and an optical unit 23 therein, generates comparatively less heat than, for example a lighting unit. A lighting unit 25, which include an LED 26 as a light source and a substrate 27 with the LED 26 mounted thereon, and generates comparatively more heat than the projection unit 21.

Figure 6:
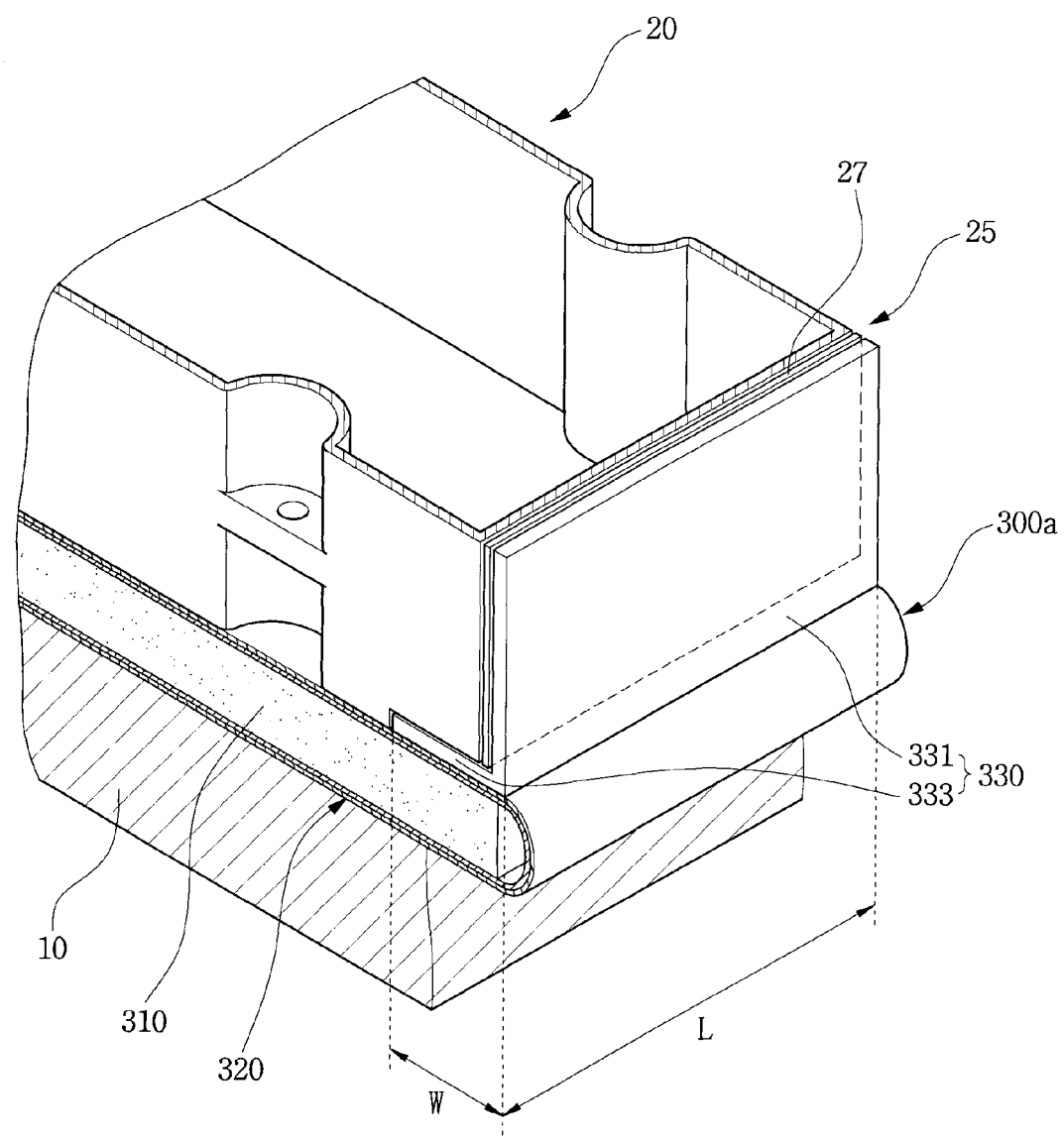
FIG. 6 is a perspective view of an electronic device having a heat radiating structure for an electronic module in accordance with another exemplary embodiment.

FIG. 6 is a perspective view of an electronic device having a heat radiating structure for an electronic module in accordance with another exemplary embodiment of the presently claimed invention.

Referring to FIG. 6, the heat radiating structure 300a in accordance with this particular exemplary embodiment includes an impact absorber 310; a heat radiating sheet 320, which covers the outside of the impact absorber 310 and is in contact with one outer surface, particularly, the bottom of the projector module 20; a heat conductive plate 330, which is formed on one side of the projector module 20 adjacent to the bottom so as to transfer heat from the side of the projector module 20 to the heat radiating sheet 320.

The impact absorber 310 absorbs impact transferred from the outside, for example, the impact transferred from the case 10 of a cellular phone. The impact absorber 310 can be arranged, for example, between one side of the cellular phone case 10, where the projector module 20 is installed, and one surface of the projector module 20, which the cellular phone case is contacting. On this arranged position, the impact absorber 310 can absorb the transferred impact from the outside, for example, one side of the cellular phone case 10. The impact absorber 310 can be made of, for example, high-density urethane foam Poron™ material produced by the Japanese INOAC Corporation, which can shrink and relax with excellent impact absorption.

The heat radiating sheet 320 may be comprised of a plurality of the multi-layered heat conductive sheets and these multi-layered heat conductive sheets can be made of the different types of conductive sheets and/or have different characteristics. For example, the plurality of the multi-layered heat sheets can be formed with a plurality of the double-layered heat conductive sheets and these heat conductive sheets can be comprised of the metal sheet 323, which is made of copper material, and the graphite sheet 321, which is stacked on the metal sheet 323. The heat radiating sheet can cover the impact absorber 310 by forming the edges as round shape. In this case, even if the impact absorber 310 covered by the heat radiating sheet 320 is freely shrunk and relaxed, the edges of the heat radiating sheet 320 will not be torn up.

Still referring to FIG. 6, one side surface of the projector module 20 in contact with the heat conductive plate 330 may be the side surface of the heavy heat generating part of the projector module 20, for example, the side surface of the lighting unit 25, which generates lots of heat.

The heat conductive plate 330 may include a first contact part 331 in contact with the side surface of the lighting unit 25, which is a heavy heat generating part; and a second contact part 333 in contact with the heat radiating sheet 320. The heat conductive plate 330 can be formed as 'L' shape or horizontally-mirrored 'L' shape. At this time, the first contact part 331 can be formed in parallel with the side of the lighting unit 25 so as to be in contact with the side of the lighting unit 25, and the second contact part 333 can be bent into the body of the projector module 20 from the edge of the first contact part 331 so as to overlap the heat radiating sheet 320 with a certain size.

Therefore, the heat generated from the lighting unit 25, which comprises a heavy heat generating part, can be transferred to the heat radiating sheet 320 through the heat conductive plate 330 in contact with the lighting unit 25 and the heat radiating unit 320, and the heat can be released to the outside by continuously transferring to the cellular phone case 10 via the heat radiating sheet 320.

In the mean time, in order to more efficiently transfer and radiate the generated heat from the lighting unit 25 to the heat radiating sheet 320, the area (W×L in FIG. 6) of the second contact part 333, that is, the contact area (i.e. where the heat conductive plate 330 and the heat radiating sheet 320 are touching each) other needs to be large enough to dissipate the heat generated from the lighting unit 25, particularly, the heat from the LED 26. When the contact area is too large, the sizes of the projector module 20 having the heat conductive plate 330 and the cellular phone having the same module may go against the latest trend of minimizing the size and the weight. Therefore, the size of the contacting area needs to be limited to the proper size to effectively dissipate the generated heat from the lighting unit 25. For example, the area of the second contact part 333 (W×L in FIG. 6), that is, the contacting area where the heat conductive plate 330 and the heat radiating sheet 320 are touching can be made of, for example, 1 cm$^2$ per 1 W according to the power that the LED 26 consumes to generate lighting. The aforementioned ratio has been provided for explanatory purposes, and the claimed invention is in no limited to the aforementioned quantities.

Figure 7:
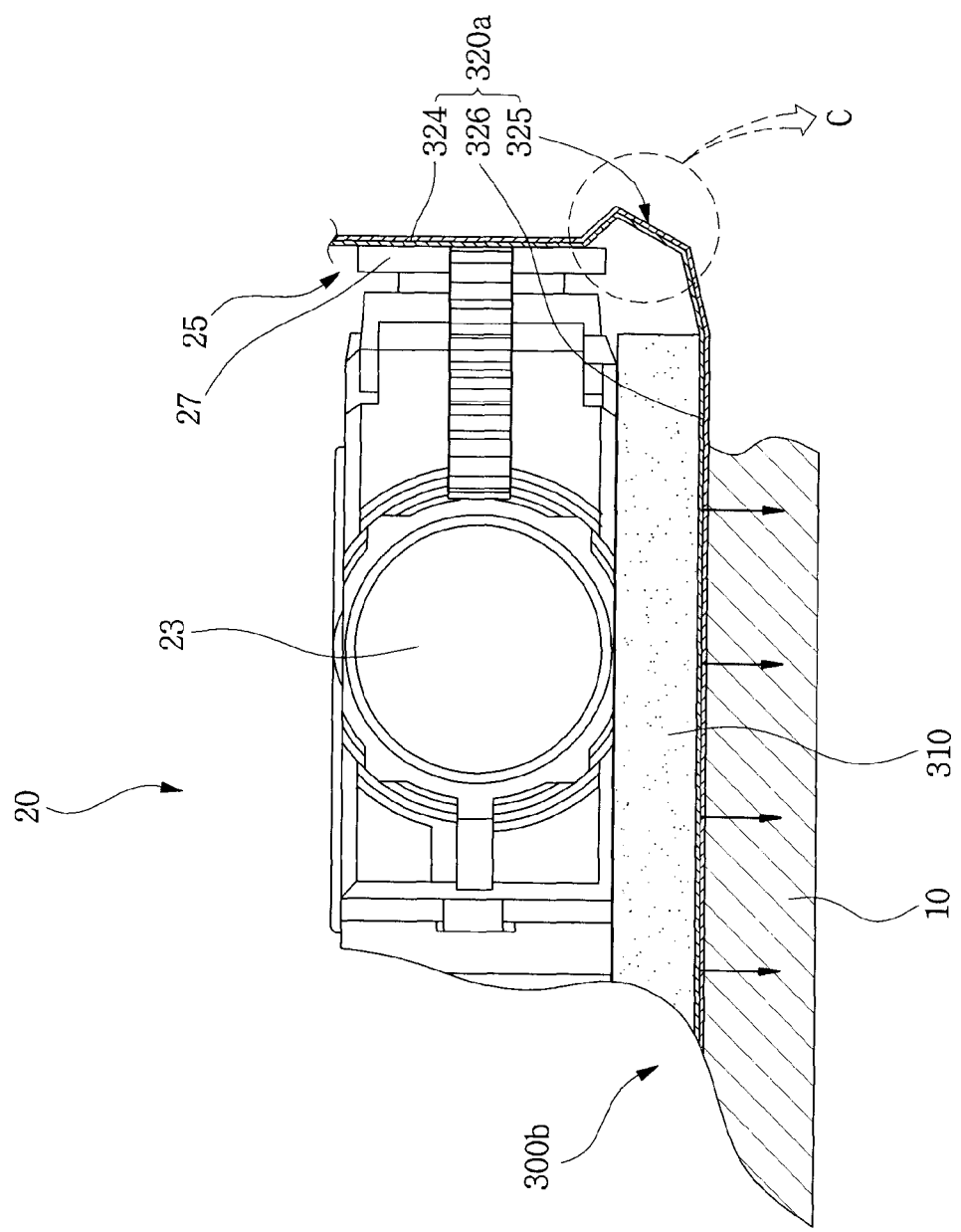
FIG. 7 is a cross-sectional view illustrating an electronic device having a heat radiating structure for an electronic module in accordance with a further exemplary embodiment.

FIG. 7 is a cross-sectional view illustrating an electronic device having a heat radiating structure for an electronic module in accordance with a further exemplary embodiment of the present invention.

As shown in FIG. 7, a heat radiating structure 300b in accordance with a further exemplary embodiment can be formed to be in contact with at least one of either the bottom of the projector module 20 or the adjacent side surface, and may include a heat radiating sheet 320a comprised of a plurality of the multi-layered heat conductive sheets; and a impact absorber 310, which is formed between the heat radiating sheet 320a and the bottom of the projector module 20 so as to absorb impact transferred from the outside.

Still referring to the example shown in FIG. 7, the heat radiating sheet 320a can include a first contact part 324 formed at the bottom of the projector module 20; a second contact part 326 formed at the side of the projector module 20; and a buffer unit 325 (C portion in FIG. 7) formed between the first contact part 324 and the second contact part 326.

According to the present invention, even though the shape of the impact absorber 310 may be changed by the impact to the projector module 20 from the outside, those contact parts 324 and 326 maintain the contacts, and the heat radiating structure 300b continues to operate as designed since there is the buffer unit 325 inside the heat radiating sheet 320a.

At this point, if the shape and structure of the buffer unit 325 prevents the heat radiating sheet 320a from changing its shape despite the outside impact, it is possible to be form the buffer unit to comprise various shapes and structures. For example, the shape and structure of the buffer unit 325 can be formed as the shoulder structure, such as, for example, a mountain peak as shown in FIG. 7.

The plurality of the heat conductive sheets can be comprised of the different heat conductive sheets, for example, which include a metal sheet 323 made of the copper material; and a graphite sheet 321 stacked on the metal sheet 323. Moreover, at least one of the side surfaces of the projector module 20 in contact with the heat radiating sheet 320 can be the side surface of the heavy heat generating part, for example, the side surface of the lighting unit 25. Furthermore, the impact absorber 310 can be made of Poron material.

While the present invention has been shown and described in connection with the preferred exemplary embodiments, it will be apparent to those skilled in the art that modifications and variations can be made without departing from the spirit and scope of the invention as defined by the appended claims.

What is claimed is:

1. A heat radiating structure for an electronic module, comprising:
    a heat radiating sheet for dissipating heat from the electronic module to an exterior, the heat radiating sheet arranged in contact with at least one outer surface of the electronic module, wherein the heat radiating sheet comprises a multi-layered heat conductive sheet composed of different types of highly heat conductive materials, wherein a highest heat conductive material is in contact with the at least one outer surface of the electronic module; wherein said heat radiating sheet is shaped to include a buffer area extending beyond the outer surface of the electronic module.

2. The heat radiating structure according to claim 1, wherein the multi-layered heat conductive sheet includes a metal sheet and a graphite sheet layered on the metal sheet.

3. The heat radiating structure according to claim 2, wherein the metal sheet comprises a copper material.

4. The heat radiating structure according to claim 1, further comprising an impact absorber for absorbing impact from outside of the electronic module.

5. The heat radiating structure according to claim 4, wherein the impact absorber comprises a urethane polymer.

6. A heat radiating structure for an electronic module, comprising:
a heat radiating sheet for dissipating heat from the electronic module to an outside area, the heat radiating sheet arranged in contact with at least one of a bottom surface and side surfaces of the electronic module, the side surfaces placed adjacent to the bottom surface, the heat radiating sheet comprising a multi-layered heat conductive sheet composed of different types of highly heat conductive materials, wherein a highest heat conductive material is in contact with the bottom surface of the electronic module; wherein said heat radiating sheet is shaped to include a buffer area between the bottom surface and the adjacent side surface.

7. The heat radiating structure according to claim 6, wherein the multi-layered heat conductive sheet includes a metal sheet and a graphite sheet layered on the metal sheet.

8. The heat radiating structure according to claim 6, wherein at least one of the side surfaces of the electronic module in contact with the heat radiating sheet comprises a side surface of a relatively heavy heat generating part of the electronic module, which mainly generates heat.

9. The heat radiating structure according to claim 6, further comprising an impact absorber for absorbing impact from outside of the electronic module.

10. The heat radiating structure according to claim 9, wherein the impact absorber comprises a urethane polymer.

11. A heat radiating structure for an electronic module, comprising:
an impact absorber for absorbing outside impact; and
a heat radiating sheet for dissipating heat from the electronic module to an exterior, the heat radiating sheet formed with a multi-layered heat conductive sheet and in contact with a bottom surface of the electronic module so as to cover an outer portion of the impact absorber, the heat radiating sheet composed of different types of highly heat conductive materials, wherein a highest heat conductive material is in contact with the bottom surface of the electronic module; wherein said heat radiating sheet is shaped to include a buffer area between the bottom surface and the adjacent side surface.

12. The heat radiating structure according to claim 11, wherein the impact absorber comprises a high density urethane polymer.

13. The heat radiating structure according to claim 11, wherein the multi-layered heat conductive sheet includes a metal sheet and a graphite sheet layered on the metal sheet.

14. The heat radiating structure according to claim 11, further comprising a heat conductive plate arranged on a side surface of the electronic module adjacent the bottom surface for transferring heat from the side surface of the electronic module to the heat radiating sheet.

15. The heat radiating structure according to claim 14, wherein the side surface of the electronic module in contact with the heat conductive plate comprises a side surface of a relatively heavy heat generating part of the electronic module, which mainly generates heat.

16. The heat radiating structure according to claim 15, wherein the heat conductive plate includes a first contact part in contact with the side surface of the heavy heat generating part and a second contact part in contact with the heat radiating sheet, and wherein the second contact part is arranged on the heat radiating sheet.

17. An electronic device comprising:
a case;
an electronic module which is fixed on a side of the case; and
a heat radiating structure for dissipating heat from an electronic module to an exterior, said heat radiating structure arranged in contact with at least one side of the electronic module,
wherein the heat radiating structure comprises a heat radiating sheet including a multi-layered heat conductive sheet composed of different types of highly heat conductive materials and shaped to include a buffer area extending beyond the heat radiating structure, wherein a highest heat conductive material is in contact with an the at least one side of the electronic module.

18. The electronic device according to claim 17, wherein the heat radiating sheet is arranged between the side of the case, where the electronic module is fixed, and an outer surface of the electronic module, which is opposite to the side of the case.

19. The electronic device according to claim 18, wherein the heat radiating structure further comprises an impact absorber.

20. The electronic device according to claim 17, wherein the plurality of the multi-layered heat conductive sheet includes a metal sheet and a graphite sheet layered on the metal sheet.

* * * * *